United States Patent
Murakami et al.

(10) Patent No.: US 6,587,504 B1
(45) Date of Patent: Jul. 1, 2003

(54) ADAPTIVE EQUALIZER AND DESIGNING METHOD THEREOF

(75) Inventors: Shuji Murakami, Hyogo (JP); Hirohisa Machida, Hyogo (JP); Hiroyuki Mizutani, Hyogo (JP); Hiroshi Ochi, Okinawa (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/432,176

(22) Filed: Nov. 2, 1999

(30) Foreign Application Priority Data

May 10, 1999 (JP) .......................... 11-128597

(51) Int. Cl.[7] .................... H03H 7/30; H04M 1/00
(52) U.S. Cl. ................. 375/232; 375/233; 375/234; 375/236; 375/341; 379/392; 379/410
(58) Field of Search ................. 375/232, 230, 375/229, 233, 234, 236, 341; 379/392, 410; 708/819

(56) References Cited

U.S. PATENT DOCUMENTS

| | | | |
|---|---|---|---|
| 5,467,394 A | * 11/1995 | Walker et al. | 379/392 |
| 5,481,564 A | * 1/1996 | Kakuishi et al. | 375/230 |
| 5,796,820 A | 8/1998 | Sasada | 379/410 |
| 5,995,561 A | * 11/1999 | Yamasaki et al. | 375/341 |
| 6,124,997 A | * 9/2000 | Hirasaka | 360/65 |
| 6,314,444 B1 | * 11/2001 | Minuhin et al. | 708/819 |
| 2002/0141495 A1 | * 10/2002 | Hatamian | 375/229 |

FOREIGN PATENT DOCUMENTS

| | | |
|---|---|---|
| DE | 198 34 695 A1 | 2/1999 |
| JP | 63-222510 | 9/1988 |
| JP | 7-176991 | 7/1995 |

OTHER PUBLICATIONS

"The LMS Algorithm with Delayed Coefficient Adaptation", by Long, et al., IEEE Transactions on Acoustics, Speech, and Processing, vol. 37, No. 9, Sep. 1989, pp. 1397–1405.
"Adaptive Digital Filters and Signal Analysis", M. G. Bellanger, New York: Marcel Dekker, 1987, pp. 96–107.
"Zeitdiskrete Signalverarbeitung" A. V. Oppenheim et al., 3rd revised edit, München et al.: Oldenbourg Verlag, 1999, pp. 372–381.

* cited by examiner

*Primary Examiner*—Stephen Chin
*Assistant Examiner*—Sam Ahn
(74) *Attorney, Agent, or Firm*—McDermott, Will & Emery

(57) ABSTRACT

Following arrangement of an adaptive equalizer with a direct filter structure according to the least mean square error architecture, look ahead conversion of modifying a tap coefficient of the next cycle utilizing the tap coefficient of a predetermined preceding cycle is carried out and then a retiming process of adjusting the timing of tap coefficients and signals is carried out to arrange delay elements, whereby a transposition filter is realized. A high-speed adaptive equalizer is provided that can have the critical path reduced without increasing the hardware amount and that is superior in expansionability.

16 Claims, 11 Drawing Sheets

F I G. 1
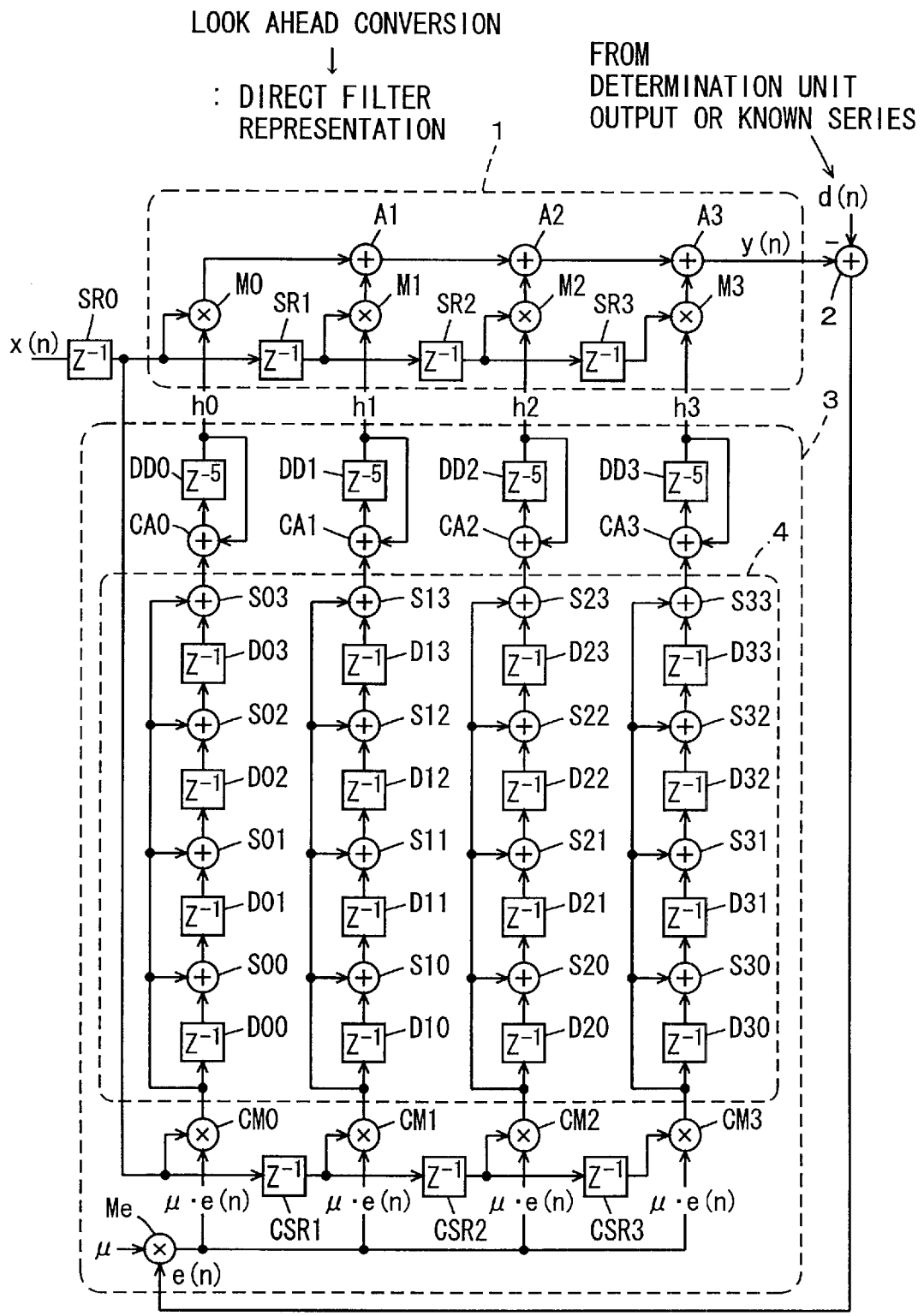

: LOOK AHEAD CONVERSION + RETIMING

: DIRECT FILTER DESCRIPTION + LOOK AHEAD CONVERSION

: LOOK AHEAD CONVERSION + RETIMING

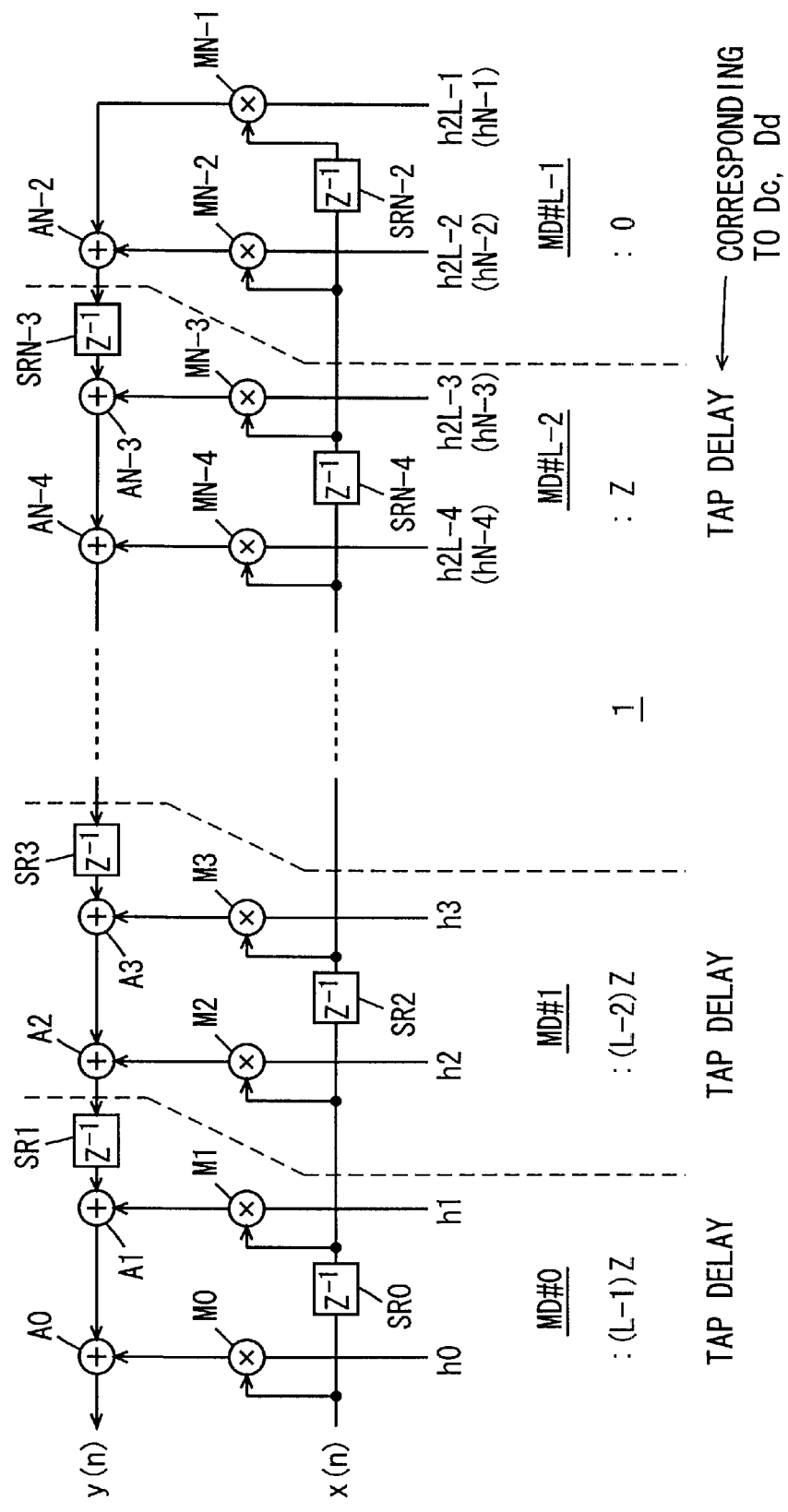
F I G. 8

: L = MODULE OF N

ADAPTIVE EQUALIZER AND DESIGNING METHOD THEREOF

BACKGROUND OF THE INVENTION

1. Field of the Invention

The present invention relates to an adaptive equalizer correcting a filter coefficient (tap coefficient) for an input signal so as to minimize the error between an output signal and a reference signal. Particularly, the present invention relates to an adaptive equalizer that can reduce the delay time of a critical path, and a method of designing that adaptive equalizer.

2. Description of the Background Art

In the field of cable television service (CATV) and the like, the usage of digital communication that employs digital signals impervious to noise instead of analog signals is now practically in progress as a high speed data communication system replacing the conventional analog communication. The presence of multiple delay waves arising from multipath propagation caused by wave reflection at the end of a non-terminated cable has been ascertained in the digital cable television service. The presence of such multiple delay waves causes multiple wave fading due to the interference between the main wave and the delay waves. When the amplitude of a delay wave approximates to that of the main wave, frequency selective fading occurs in which a particular frequency component is attenuated significantly, to result in generation of waveform distortion. This waveform distortion may induces code error by inter-symbol interference. It is necessary to prevent generation of frequency selective fading caused by such multiple delay waves in high speed digital transmission.

An adaptive equalizer that adaptively removes inter-symbol interference arising from multipath propagation has been studied as one technique to solve this frequency selective fading. In digital communication, data referred to as "symbol" is transmitted at every predetermined period referred to as "symbol cycle". In an ideal transmission path free from multipath propagation, one symbol will not affect another symbol transmitted at another symbol cycle. However, when multiple delay waves are generated by multipath propagation, a plurality of symbols will arrive at the reception side in the same symbol cycle by the delay waves. More specifically, inter-symbol interference occurs to disable proper reception and reproduction of transmitted signals.

The above-described problem of frequency selective fading occurs, not only in wire communication utilizing a cable, but also in wireless transmission paths utilizing microwaves.

The LMS (Least Mean Square Error Algorithm) architecture is often employed for the adaptive equalizer used in digital communication. The basic structure of this LMS architecture includes an FIR (Finite Impulse Response) filter.

FIG. 11 shows the basic structure of a conventional adaptive equalizer. This adaptive equalizer includes a filter processing unit 1 applying a filtering process on an input signal x(n), an error detection circuit 2 obtaining an error between an output signal y(n) of filter processing unit 1 and a reference signal d(n), and a coefficient update circuit 3 correcting tap coefficients (filter coefficients) h0~hN−1 of filter processing unit 1 according to an output signal e(n) of error detection circuit 2.

Filter processing unit 1 is formed of a direct type discrete filter. A discrete input signal x(n) extracted from the response characteristics at the time region is filtered according to tap coefficients h0~hN−1, to produce a discrete output signal y(n). Reference signal d(n) is output from an identification circuit (or determination circuit) that estimates a final output signal (code) from output signal y(n) of filter processing unit 1.

Discrete filter 1 includes delay elements SR0~SRN−1 connected in series and each formed of a shift register delaying input signal x(n) by one clock cycle period, multipliers M0~MN−1 multiplying the output signals of delay elements SR0~SRN−1 by corresponding tap coefficients h0~hN−1, and adders A1~AN−1 provided corresponding to multipliers M1~MN−1, respectively, for adding the output signals of preceding adders with the output signals of corresponding multipliers to transmit the addition result to succeeding adders. Output signal y(n) is generated from the last stage adder AN−1. Here, the output nodes of delay elements SR0~SRN−1 are generally referred to as "taps". Therefore, direct filter 1 is an N-tap filter. As to "$Z^{-1}$" of delay elements SR0~SRN−1, the exponent indicates the amount of delay.

Error detection circuit 2 is generally formed by an adder. Output signal y(n) is subtracted from reference signal d(n). That difference value is output as the error caused by frequency selective fading.

Coefficient update circuit 3 includes a multiplier Me multiplying error signal e(n) by step size $\mu$, and tap coefficient update stages provided corresponding to tap coefficients h0~hN−1, respectively. The tap coefficient update stages have the same structure, and each include a delay element CSR (CSR0~CSRN−1) formed of a shift register that delays the signal from the preceding stage by one clock cycle, a multiplier CM (CM0~CMN−1) multiplying an output signal $\mu \cdot e(n)$ of multiplier Me by the output signal of a corresponding delay element, an adder CA (CA0~CAN−1) receiving the output signal of multiplier CM, and a delay element CSF (CSF0~CSFN−1) formed of a shift register that delays the output signal of adder CA by one clock cycle. The output signal of delay element CSF is applied to adder CA. Adder CA adds the output signal of a corresponding multiplier CM with the output signal of a corresponding delay element CSF to provide the addition result to delay element CSF again.

Step size $\mu$ indicates the step size of a discrete value of discrete input signal x(n) to normalize the error signal by multiplier Me. This step size is generally a multiple of 2. Multiplier Me is formed of a bit shift circuit that shifts error signal e(n) towards the higher bit in order to multiply error signal e(n) by step size $\mu$ represented by 2 raised to the power. The operation of the adaptive equalizer shown in FIG. 11 will be described now.

Each of delay elements SR0~SRN−1, CSF0~CSFN−1, and CSR0~CSRN−1 carries out a shift operation according to a clock signal not shown to implement delay of one clock cycle. Output signal y(n) of filter processing unit 1 is related to input signal x(n) by the following equation.

$$y(n) = \Sigma hk \cdot x(n-k)$$

The summation is taken from 0 to N−1 for k. Error signal e(n) is represented by the difference between reference signal d(n) and output signal y(n). Therefore, the following equation is obtained.

$$e(n) = d(n) - y(n)$$
$$= d(n) - \sum hk \cdot x(n-k)$$
$$= d(n) - h^T(n) \cdot X(n)$$

where $h^T(n) = [h0(n), h1(n), \ldots, hn-1(n)]$,
$X^T = [x(n), x(n-1), \ldots, x(n-N+1)]$, and
T represents transposition.

The tap coefficient of the next cycle is related to the tap coefficient of the current cycle by the following equation.

$$h(n+1) = h(n) + \mu \cdot e(n) \cdot X(n)$$

One tap coefficient hk is corrected according to the following equation.

$$hk(n+1) = hk(n) + \mu \cdot e(n) \cdot x(n-k)$$

In the above equation, the output signals of shift registers (delay element) SR0 and CSR0 of the first input stage shown in FIG. 11 are set as x(n).

By correcting filter coefficients h0~hN-1 according to error signal e(n), the error component included in output signal y(n) may be removed to provide a more ideal output signal y(n).

In the adaptive equalizer shown in FIG. 11, the direct filter of filter processing unit 1 is formed of an FIR filter (non-recursive filter). Delay elements SR0~SRN-1 each are a shift register transferring a signal according to a clock signal not shown. It is necessary to generate an output signal y(n) and also a tap coefficient for the next cycle within one cycle period of this clock signal. When the tap length of filter processing unit 1 is N, the critical path includes two multipliers M0 and CM0, N adders A1~AN-1, error detection circuit 2, and adder CA0 as shown by the solid line in FIG. 11. Here, multiplier Me carries out the operation of $\mu \cdot e(n)$ by the bit shift operation, and has the delay ignored. Therefore, the delay in this critical path includes the delay of 2 multiplications +(N+2) additions.

Therefore, the critical path of the adaptive equalizer according to the LMS architecture depends on tap length N of filter processing unit 1, and becomes longer for the LMS architecture of a higher order. It is therefore difficult to improve the throughput, and there is a problem that it is difficult to carry out high speed processing such as image data transmission.

SUMMARY OF THE INVENTION

An object of the present invention is to provide an adaptive equalizer that can have the critical path shortened without increasing the hardware amount.

Another object of the present invention is to provide an adaptive equalizer having a critical path independent of the tap length.

In the adaptive equalizer of the present invention, the LMS architecture formed of a direct FIR filter is converted into an LMS architecture formed of a transposition FIR filter employing the look ahead conversion using the input signal preceding by L cycles and the retiming process of equivalent replacement of the signal delay.

According to a first aspect of the present invention, an adaptive equalizer includes a filter processing unit having a plurality of cascaded processing stages provided corresponding to taps. Each processing stage includes a multiplier to multiply an input signal by a corresponding tap coefficient, a delay stage delaying the output signal of a preceding processing stage, and an adder adding the output signal of the delay stage with the output signal of the multiplier to provide the addition result to the next stage. The first processing stage includes a multiplier multiplying the input signal by a corresponding tap coefficient for application to the next processing stage.

The adaptive equalizer of the first aspect includes a tap coefficient set circuit for setting a tap coefficient according to the error between the output signal of the filter processing stage and a reference signal. The tap coefficient set circuit includes a coefficient correction stage provided corresponding to each tap coefficient. Each coefficient correction has the same structure, and has the transfer function represented by the product of the an all zero filter transfer function and an all pole filter transfer function.

According to a second aspect of the present invention, an adaptive equalizer includes a filter processing unit having a plurality of processing stages connected in series in the forward and backward paths. Each processing stage includes a multiplier multiplying an applied signal by a corresponding tap coefficient, and an adder adding the output signal of the multiplier with the signal applied from the succeeding processing stage to transmit the addition result to the preceding stage. In the forward and backward paths of the processing stages, a delay stage that delays an applied signal by one cycle is interposed alternately.

The adaptive equalizer of the second aspect further includes a tap coefficient set circuit for setting a tap coefficient according to the error between the output signal of the filter processing stage and a reference signal. The tap coefficient set circuit includes coefficient correction stages having the same structure and provided corresponding to respective tap coefficients. Each coefficient correction has the transfer function given by the product of an all zero filter transfer function and an all pole filter transfer function.

According to a third aspect of the present invention, a method of designing an adaptive equalizer includes the steps of arranging a filter processing stage and a tap coefficient set circuit according to the LMS architecture using a direct filter structure, carrying out look ahead conversion for relating a tap coefficient preceding by L cycles with the tap coefficient of the next cycle to rearrange the filter processing stage and the tap coefficient set circuit, carrying out a retiming process for timing reorganization while maintaining the time relationship of signals to reorganize arrangement of the delay elements for realizing a transposition filter, and modifying the filter coefficient set stage to a filter stage having the transfer function of $(1-Z^{-L-1})/(1-Z^{-1})$ through equivalent conversion.

By carrying out equivalent conversion using look ahead conversion and retiming to modify the direct FIR filter according to the LMS architecture into a transposition FIR filter, a delay element operating in response to a clock signal can be interposed in the critical path. The critical path can be shortened without increasing the number of functional units. An adaptive equalizer operating at high speed can be realized.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows arrangement of an adaptive equalizer of the first step according to a first embodiment of the present invention.

FIG. 8 schematically shows a structure of a filter processing unit of an adaptive equalizer according to a third embodiment of the present invention.

DESCRIPTION OF THE PREFERRED EMBODIMENTS

First Embodiment

FIG. 1 shows a structure of an adaptive equalizer of the first arrangement step according to a first embodiment of the present invention. Referring to FIG. 1, the arrangement modification is made, starting from the adaptive equalizer with a direct filter 1 of a tap length of 4 shown in FIG. 11. The arrangement of the adaptive equalizer of FIG. 1 corresponds to the LMS architecture formed of the direct FIR filter of FIG. 11 modified according to "look ahead conversion". In the "look ahead conversion", the tap coefficient of the next cycle is represented using not the coefficient of the immediately preceding cycle, but the coefficient preceding by L cycles. By carrying out "look ahead conversion" on the tap coefficient update equation of the LMS architecture, the relationship indicated by the following equation can be obtained.

$$h(n+1) = h(n) + \mu \cdot e(n) \cdot X(n)$$
$$= h(n-1) + \mu \cdot e(n-1) \cdot X(n-1) + \mu \cdot e(n) \cdot X(n)$$
$$= h(n-2) + \mu \cdot e(n-2) \cdot X(n-2) + \mu \cdot e(n-1) \cdot X(n-1) + \mu \cdot e(n) \cdot X(n)$$
$$\ldots$$
$$= h(n-L) + \mu \cdot \sum e(n-i) \cdot X(n-i)$$

Here, the summation $\Sigma$ is taken from 0 to L for i. L indicates the number of stages of look ahead conversion. Error signal e(n) is represented by the following equation.

$$e(n) = d(n) - h^T(n-L) \cdot X(n) = d(n) - y(n)$$

When the number of stages, L, of look ahead conversion is 4, tap coefficient h0 is represented by the following equation with i=0~4.

$$h0\,(n+1) = h0\,(n-4) + \mu \cdot \Sigma e(n-i) \cdot x(n-i)$$

Error signal e(n) and input signal x(n) are stored respectively for L cycles, and their multiplied values are added. Then, addition with a tap coefficient value h0 of a cycle preceding by L cycles is effected to obtain the tap coefficient of the next cycle. The arrangement of FIG. 1 implements the above equation with the direct format. Therefore, a look ahead conversion unit 4 is newly added in coefficient update circuit 3 for this look ahead conversion.

Figure 11:
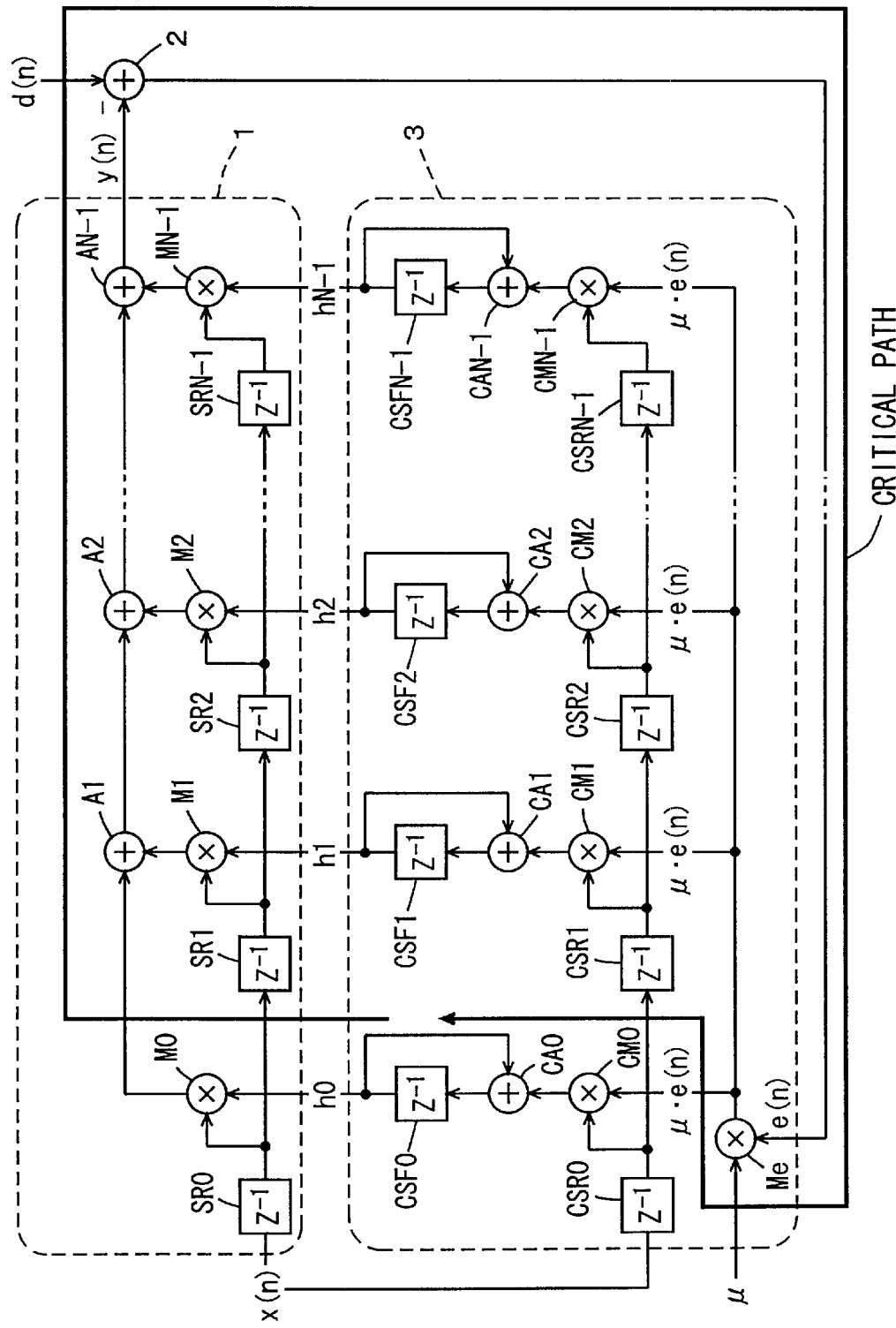
FIG. 11 shows a structure of a conventional adaptive equalizer.

The structure of the direct filter of filter processing unit 1 is identical to that shown in FIG. 11. The relationship between output signal y(n) and input x(n) is identical to that shown in FIG. 11.

In coefficient update circuit 3, a coefficient modify stage of the same structure is arranged corresponding to each of taps h0~h3. Delay element CSR0 shown in FIG. 11 is commonly represented by delay element SR0, and an input signal from delay element SR0 is applied to coefficient update circuit 3.

Referring to FIG. 1, coefficient update circuit 3 includes multipliers CM0~CM3 each multiplying the product $\mu \cdot e(n)$ between error signal e(n) from multiplier Me and step size $\mu$ by an applied input signal, and delay elements (delay circuits) SCR1~SCR3 provided corresponding to multipliers CM1~CM3, respectively, formed of shift registers delaying applied input signals by one cycle and providing the delayed signals to corresponding multipliers CM1~CM3. This structure is identical to the structure shown in FIG. 11. Multiplier Me implements multiplication by the bit shift operation.

Look ahead conversion unit 4 is provided to implement the summation portion of the above coefficient update equation. The stage corresponding to a step coefficient has the same structure. More specifically, the stage (any of i=0~3) corresponding to tap coefficient hi includes a delay element Di0 delaying the output signal of a corresponding multiplier CMi by one cycle, an adder Si0 adding the output signals of delay element Di0 and corresponding multiplier CMi, a delay element Di1 delaying the output signal of adder Si0 by one clock cycle, an adder Si1 adding the output signal of multiplier CMi with the output signal of delay element Di1, a delay element Di2 delaying the output signal of adder Si1 by one clock cycle, an adder Si2 adding the output signal of delay element Di2 with the output signal of multiplier CMi, a delay element Di3 delaying the output signal of adder Si2 by one clock cycle, and an adder Si3 adding the output signal of delay element Di3 with the output signal of multiplier CMi. Output signal $\mu \cdot e(n)$ of multiplier Me is applied to multiplier CMi. In the stage corresponding to tap coefficient hk, the signal represented by the following equation is output from adder Sk3 of the last stage:

$$\mu \cdot \Sigma e(n-i) \cdot x(n-k-i).$$

The summation is taken from 0 to 4 (=L) for i.

In the above equation, the signal output from delay element SR0 is used as input signal x(n).

The coefficient of preceding-by-L cycle is to be used. Therefore, for tap coefficients h0~h3, adders CA0~CA3 and delay elements DD0~DD3 delaying the output signals of adders CA0~CA3 by 5 clock cycles are provided corresponding to adders S03~S33 of look ahead conversion unit 4. The output signals of delay elements DD0~DD3 are fed back to adders CA0~CA3. Tap coefficients h0~h3 are output from delay elements DD0~DD3. Adders CA0~CA3 add output signals of corresponding adders S30~S33 with the output signals of corresponding delay elements DD0~DD3, respectively.

Coefficient hk (n+1) is updated according to coefficient hk (n−L) and the summation of the products of the error components, and the input signals from the current cycle to the preceding-by-L cycle.

It is to be noted that delay elements DD0~DD3 delay the signals by 5 clock cycles. Corresponding to tap coefficient hk delayed by one delay element stage in FIG. 11, the delay amount of the delay elements DD0–003 is increased by 1 clock cycle with respect to the look ahead stages. This is because the correction by the tap coefficient of the preceding-by-L cycle must be carried out, not at the current cycle, but at the next cycle.

In the case of the direct architecture of FIG. 1, filter processing unit 1 is a direct filter, and the critical path thereof depends upon the tap length. Also, the structure of coefficient update circuit 3 becomes redundant. Thus, a transposition FIR adaptive filter is implemented by moving the delay elements while conserving the time relationship of the signals by means of "retiming".

Figure 2:
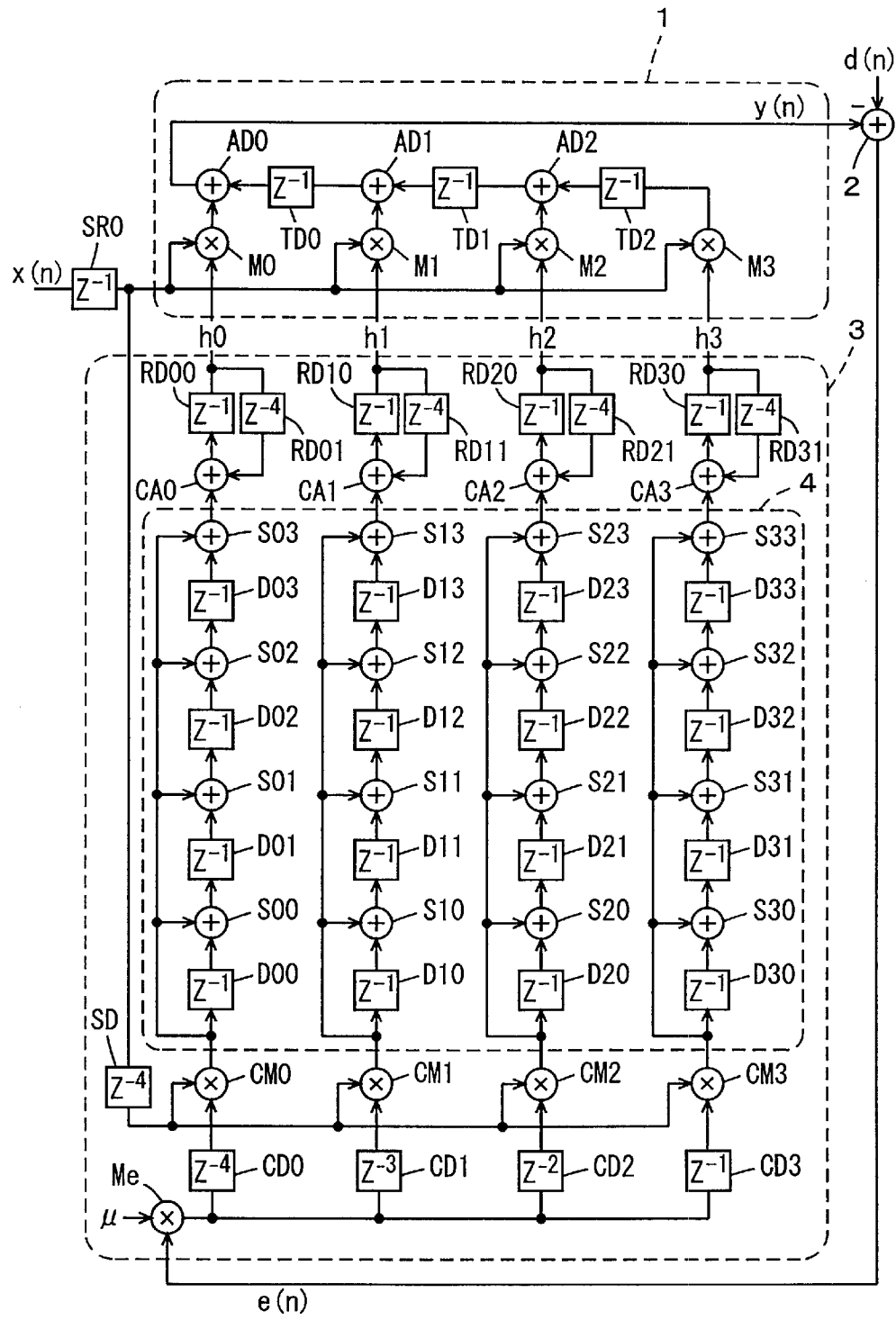
FIG. 2 shows arrangement of the adaptive equalizer of the second step according to the first embodiment of the present invention.

FIG. 2 shows a structure of an adaptive equalizer subjected to this retiming process. According to the structure of FIG. 2, a direct FIR filter is converted into a transposition filter in filter processing unit 1. The propagation path of the input and output signals are transposed. More specifically, in filter processing unit 1, the input signal from delay element SR0 is applied to multipliers M0~M3 provided corresponding to tap coefficients h0~h3, respectively. Adders AD0~AD2 are provided corresponding to multipliers M0~M2. Delay elements TD0~TD2 are provided at the inputs of adders ADO~AD2. Delay element TD0 delays the output signal of adder AD1 by 1 clock cycle to provide the delayed signal to adder AD0. Delay element TD1 delays the output signal of adder AD2 by 1 clock cycle to provide the delayed signal to adder AD1. Delay element TD2 delays the output signal of multiplier M3 by 1 clock cycle to provide the delayed signal to adder AD2.

In the structure of the transposition filter of filter processing unit 1, output signal y(n) is represented by the following equation.

$$y(n)=\Sigma x(n-k)\cdot hk(n-k)$$

The summation is obtained from 0 to 3 for k.

In the structure of this transposition filter, tap coefficients h0~h3 are distributed over 4 clock cycles. More specifically, there are tap coefficients h0 (n), h1 (n−1), h2 (n−2), and h3 (n−3). It is necessary to use the value of the tap coefficient of the current cycle n. For the purpose of adjusting the timing of the tap coefficient, delay elements CD0~CD3 delaying error signal e(n) by 4 cycles, 3 cycles, 2 cycles and 1 cycle, respectively, are provided corresponding to respective tap coefficients in coefficient update circuit 3. Also, since it is necessary to obtain the tap coefficient after 4 cycles, the input signal from delay element SR0 is further delayed by 4 clock cycles in delay element SD.

In coefficient update circuit 3, delay elements DD0~DD3 each are divided into two delay elements. More specifically, there are provided delay elements RD00~RD30 delaying respective output signals of adders CA0~CA3 by 1 clock cycle to generate tap coefficients h0~h3, and delay elements RD01~RD31 delaying tap coefficients h0~h3, respectively, by 4 clock cycles to provide the delayed signals to respective adders CA0~CA3. In this tap coefficient update, the delay of 5 clock cycles is implemented by delay elements RD00~RD3 and corresponding delay elements RD01~RD31 0. Delay elements RD00~RD30 are provided to retain tap coefficients h0~h3 by 1 clock cycle for outputting at the next cycle.

Tap coefficients h0~h3 are shifted in time by 1 clock cycle from each other. It is therefore necessary to use the tap coefficients, of the succeeding-by-one clock cycle, the succeeding-by-two clock cycle, and the succeeding-by-three clock cycle with respect to tap coefficient h0, as tap coefficients h1~h3. Delay elements CD0~CD3 are provided for this purpose. In coefficient update circuit 3, a tap coefficient is generated according to the input signal and the error signal preceding by four cycles the tap coefficient h0. For tap coefficient h1, the error signal is the error signal of the succeeding-by-one clock with respect to that of tap coefficient h0. Therefore, the tap coefficient is corrected according to the error signal of the succeeding-by-one cycle relative to tap coefficient h0, for tap coefficient h1. Thus, tap coefficient h1 corresponds to a correction value delayed by 1 clock cycle with respect to tap coefficient h0. Similarly, tap coefficients h2 and h3 are updated according to an error signal of the succeeding-by-two clock cycle and succeeding-by-three clock cycle, respectively, with respect to tap coefficient h1. Therefore, tap coefficients h2 and h3 correspond to the tap coefficients of two clock cycles and three clock cycles later with respect to tap coefficient h0. Thus, the timing is matched, and an output signal represented by the following equation is generated as output signal y(n) from filter processing unit 1.

$$y(n)=\Sigma hk(n)\cdot x(n-k)$$

The summation is taken from 0 to 3 for k. Thus, an output signal y(n) having the input-output relationship identical to that of the direct type is generated. In the structure shown in FIG. 2, the structure of the look ahead conversion unit is still redundant. The portion corresponding to each tap coefficient is formed of the gradient addition module (cascade-connection of adder and delay element). The transfer function of the gradient addition module is represented as $1+Z^{-1}+\ldots+Z^{-L}$ (L=4 in the structure of FIG. 2). This transfer function can be replaced with the transfer function of the following equation:

$$(1-Z^{-L})/(1-Z^{-1})$$

This is provided by the product of the transfer function of the all pole filter and the transfer function of the all zero filter. A delay element having the delay time of L+1 cycles and a delay element having a delay time of 1 cycle are used to realize this transfer function. The all pole filter (recursive filter of order 1) is produced by the delay element of 1 cycle.

Figure 3:
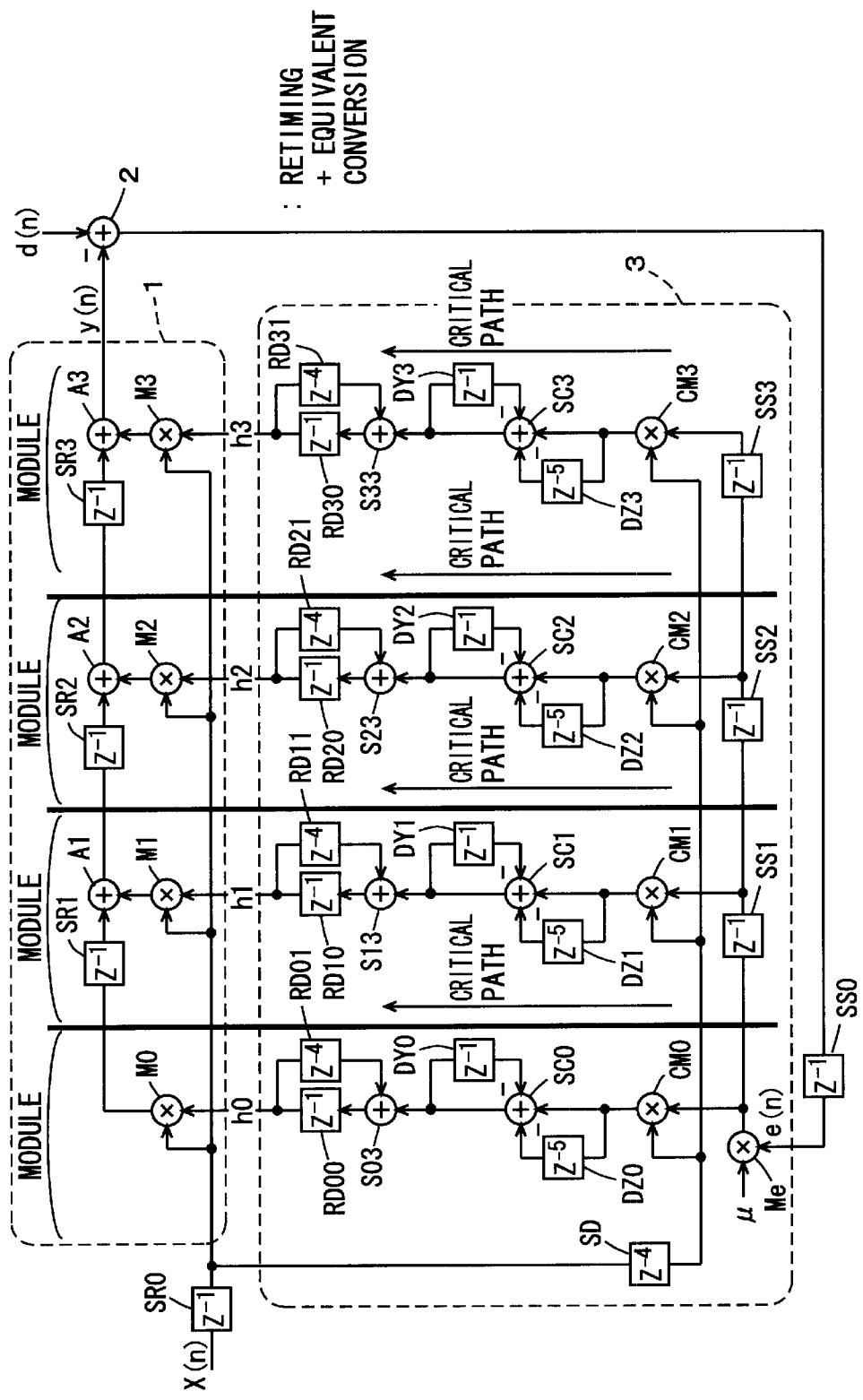
FIG. 3 shows a structure of an adaptive equalizer according to the first embodiment of the present invention.

FIG. 3 shows a structure of an adaptive equalizer according to the first embodiment of the present invention. In coefficient update circuit 3 shown in FIG. 3, the gradient addition module of look ahead conversion unit 4 is replaced with a delay element DZi delaying the output signal of multiplier CMi (i=0~3) by 5 clock cycles, an adder SCi, and a delay element DYi delaying the output signal of adder SCi by one clock cycle to provide the delayed signal to adder SCi again. Adder SCi subtracts the output signals of delay elements DZi and DYi from the output signal of a corresponding multiplier CMi to provide the resultant signal to adder Si3.

The filter having a transfer function represented by the product of the all pole filter transfer function, $1/(1-Z^{-1})$, and the all zero filter transfer function, $(1-Z^{-5})$, is implemented by adder SCi and delay elements DZi and DYi.

In filter processing unit 1, the structure of the transposition filter is reorganized such that the directions of the flow of the delay signals and the flow of the input signals are identical. In this case, adders A1~A3 are arranged corresponding to multipliers M1~M3. Delay elements (delay element of 1 clock cycle delay) SR1~SR3 are arranged at the inputs of adders A1~A3. Delay element SR1 delays the output signal of multiplier M0 by 1 clock cycle. Delay elements SR2 and SR3 delay the output signals of adders A1 and A2 by 1 clock cycle to provide the delayed signal to adders A2 and A3, respectively.

In filter processing unit 1 of the transposition filter structure, delay elements SS1~SS3 are provided corresponding to multipliers SM1~SM3 respectively instead of delay elements CD0~CD3, to adjust the time relationship of tap coefficients h0~h3 since the signal flow is changed again. Delay elements SS1~SS3 each delay the applied signal by 1 clock cycle.

The signal flow is reversed in this transposition filter process. Output signal y(n) is represented by the following equation:

$$y(n)=\Sigma hk(n-3+k) \cdot x(n-3+k).$$

The summation is taken from 0 to 3 for k. Tap coefficients h1, h2 and h3 must be corrected using a tap coefficient of the preceding-by-one cycle, the preceding-by-two cycle, and the preceding-by-three cycle, respectively, with respect to tap coefficient h0. Delay elements SS1~SS3 are provided for this purpose. By delaying error signal e(n) by 1 clock cycle using delay element SS0, compensation is made for the delay of input signal x(n) by 1 clock cycle by delay element SR0. An error signal e(n) corresponding to the determination signal (identification signal) at the time of input of input signal x(n) can be generated.

In the structure of FIG. 3, delay elements SR1~SR3 are interposed in the propagation path of the input signal, These delay elements SR1~SR3 are formed of shift registers, and operate in synchronization with a clock signal. In coefficient update circuit 3, delay elements SS1~SS3 are provided at the path where the error signal from multiplier Me is transmitted. Delay element SS0 is arranged between multiplier Me and error detection circuit 2. The critical path of the adaptive equalizer of FIG. 3 corresponds to the paths from delay elements SS0~SS3 to respective adders S03~S33. Here, multiplier Me realizes the multiplication operation by the bit shift operation, and has a negligible delay. Therefore, this critical path has the delay of 1 multiplication and 3 additions. It is assumed that adders SC0~SC3 are three-input adders, corresponding to the structure of 2 additions. Since this critical path does not depend upon the tap length of the adaptive equalizer, high speed processing can be carried out. In filter processing unit 1, the taps are coupled by the delay elements to allow execution of the pipe line process. A pipe line architecture independent of the tap length can be realized, resulting in high speed processing.

As shown in FIG. 3, the portion corresponding to each tap coefficient is implemented by a regular arrangement (systolic structure of transmitting a signal in one direction). The portion corresponding to the tap coefficient can be made as a module to facilitate expansion of the tap length. Also, the interconnection layout is facilitated by virtue of the regular arrangement. An LSI-ed adaptive equalizer suitable for high integration and of a short critical path can be realized.

An adaptive equalizer having a tap length of 4 is described in FIGS. 1–3. For an adaptive equalizer having the tap length of L, the module shown in FIG. 3 are to be cascaded by L in number. In this case, the delay element having the delay time of 4 cycles (represented by $Z^{-4}$) may have its delay characteristic represented by $Z^{-L}$. Delay elements DZ0~DZ3 having the delay characteristic of $Z^{-5}$ can have the delay characteristic represented by $Z^{-(L+1)}$.

According to the first embodiment of the present invention, following the implementation of an LMS architecture with a direct filter structure, "look ahead conversion" and "retiming" are carried out to implement a transposition filter. Furthermore, the delay elements are reorganized such that delay elements formed of shift registers operating in synchronization with a clock signal can be arranged at the signal propagation path. Thus, an adaptive equalizer that can shorten the critical path and that operates at high speed can easily be realized.

Second Embodiment

Consider the case where the number of stages, L, of the look ahead conversion is set to ½ the tap length N. In this case, the tap coefficient update equation is represented by the following equations:

$$h(n+1)=h(n-2)+\mu \cdot \Sigma e(n-i) \cdot X(n-i), \; e(n)=d(n)-h^T(n-2) \cdot X(n)$$

In the above equations, the summation $\Sigma$ is executed for 0, 1 and 2 as i. The transposition FIR adaptive filter obtained by carrying out look ahead conversion and retiming at ½ the tap length is defined as "half TrLMS". In this half TrLMS, only the tap coefficient of the preceding-by-L/2 cycle affects the tap coefficient update. The delay of the input/output response compensation (latency) can be reduced.

Figure 4:
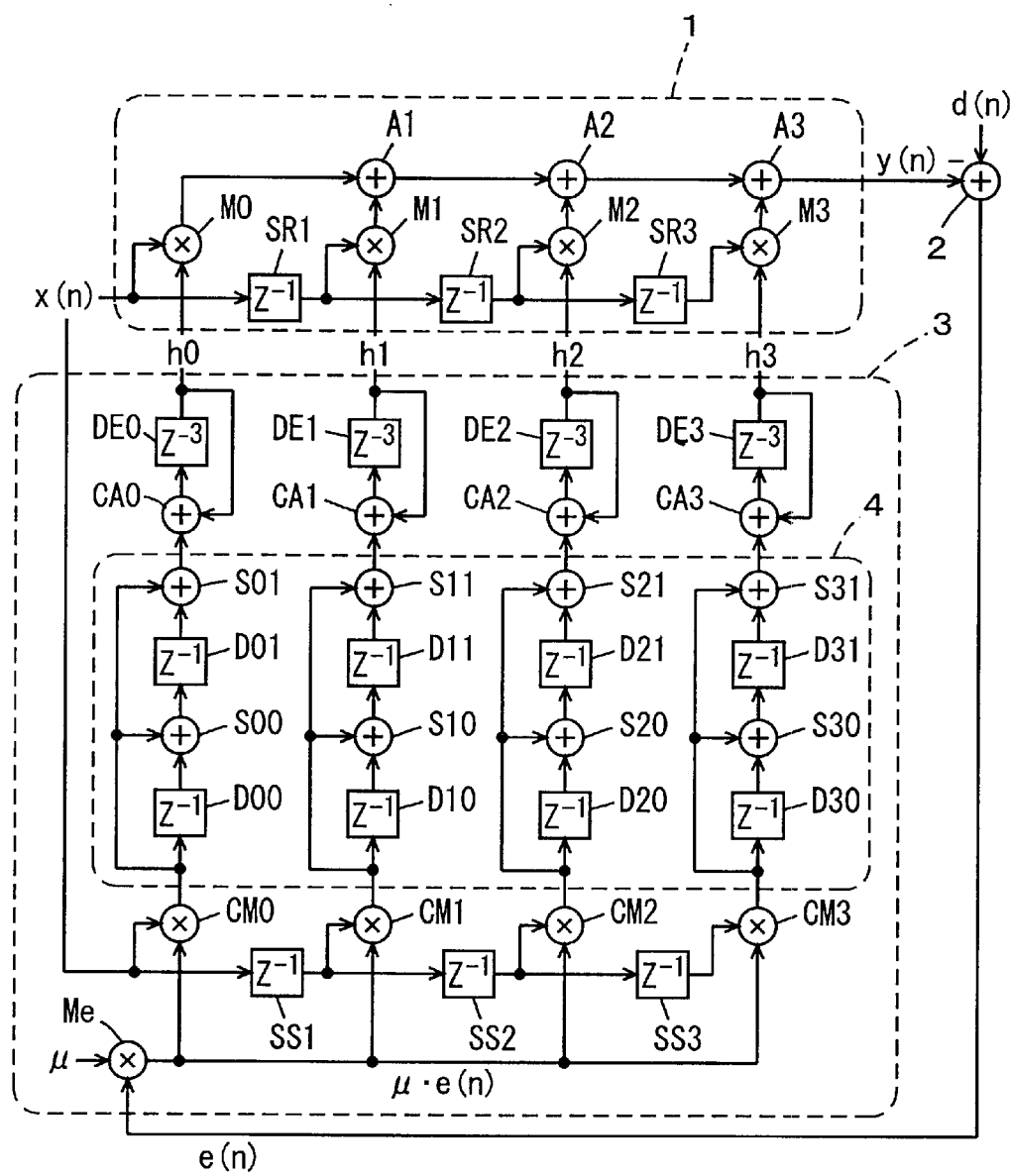
FIG. 4 shows a structure of an adaptive equalizer of the first arrangement step according to a second embodiment of the present invention.

FIG. 4 shows a structure of the half TrLMS according to the above equation. Referring to FIG. 4, the adaptive equalizer includes a filter processing 1 formed of the direct type FIR filter, and a coefficient update circuit 3 updating tap coefficients h0~h3 for filter processing unit 1 according to an error signal e(n). The structure of filter processing unit 1 is identical to that of filter processing unit 1 of the conventional adaptive equalizer shown in FIG. 11 in the look ahead conversion. In coefficient update circuit 3, a look ahead conversion unit is interposed by this look ahead conversion.

More specifically, coefficient update circuit 3 includes cascaded delay elements SS1~SS3 each delaying input signal x(n) by 1 clock cycle, and correction stages of the same structure provided corresponding to tap coefficients h0~h3.

The correction stage provided corresponding to tap coefficient hk includes a multiplier CMk multiplying an input signal x (n-k) by an error correction signal $\mu \cdot e$ (n) from multiplier Me, a delay element Dk0 delaying the output signal of multiplier CMk by one clock cycle, an adder Sk0 adding the output signal of delay element Dk0 with the output signal of multiplier CMk, a delay element Dk1 delaying the output signal of adder Sk0 by 1 clock cycle, an adder Sk1 adding the output signal of delay element Dk1 with the output signal of multiplier CMk, an adder CAk receiving the output signal of adder Sk1, and a delay element DEk delaying the output signal of adder CAk by 3 clock cycles (=L+1) to output a tap coefficient hk.

Adder CAk adds tap coefficient hk output from delay element DEk with the output signal of adder Sk1 to provide the addition result to delay element Dk.

Focusing on one tap coefficient in the above-described tap coefficient update equation, the tap coefficient update equation is represented by the following equation.

$$hk(n+1)=hk(n-2)+\mu \cdot e(n) \cdot x(n-k+1)+\mu \cdot e(n-1) \cdot x(n-k)+\mu \cdot e(n-2) \cdot x(n-k-1)$$

Coefficient hk (n-2) is generated by delay element DEk. The number of delay cycles of delay element DEk is 3 cycles, i.e. L+1 cycles. This corresponds to the fact that the difference in the number of clock cycles between tap coefficient hk (n+1) and tap coefficient hk (n-2) related in the above equation is 3 cycles.

Multiplier CMk, delay elements Dk0 and Dk1, and adders Sk0 and Sk1 arranged in a systolic manner implement the error correction portion of the above equation.

Figure 5:
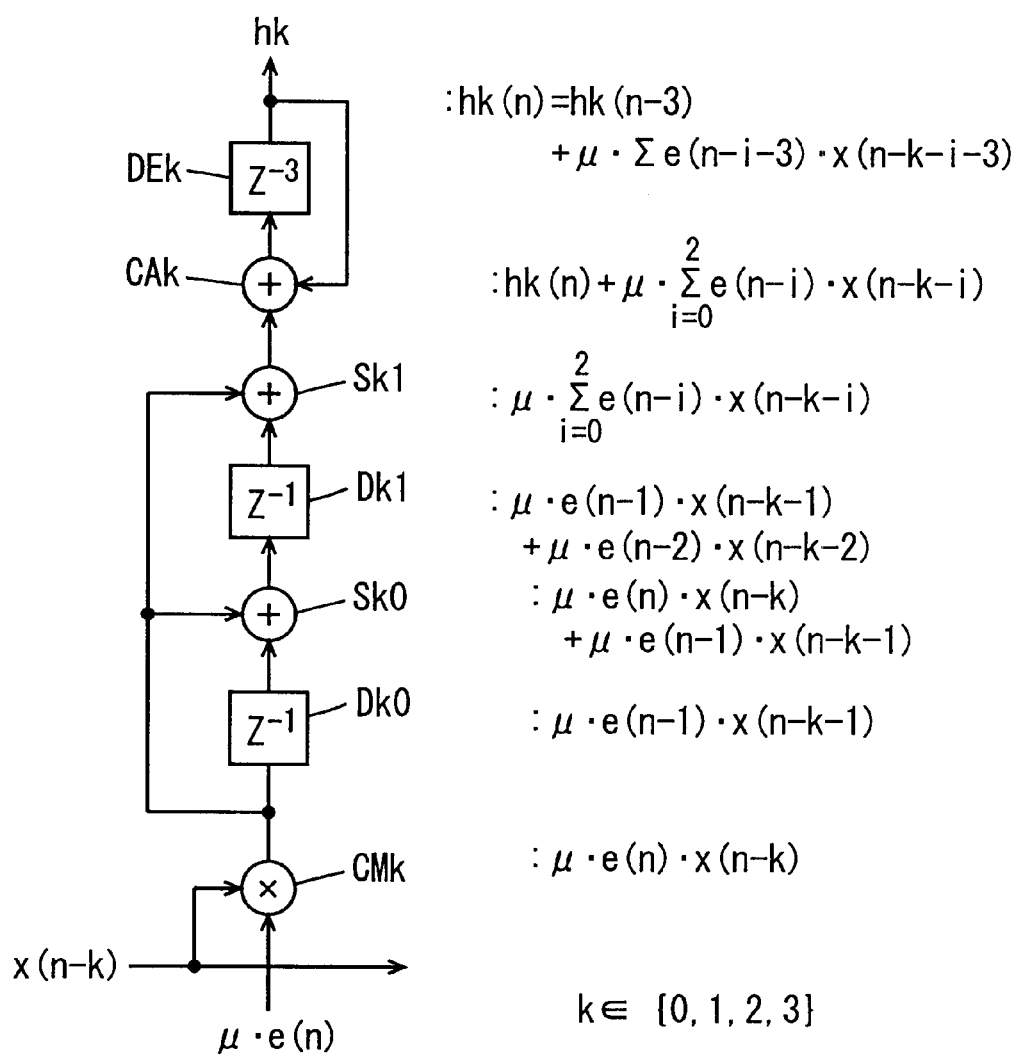
FIG. 5 shows an output signal of a coefficient update circuit shown in FIG. 4.

FIG. 5 shows a structure of the correction stage provided corresponding to one tap coefficient hk in coefficient update circuit 3 of FIG. 4. The coefficient update operation will be described now with reference to FIG. 5.

When input signal x(n) is applied, signal x (n–k) is provided to multiplier CMk. Therefore, a signal represented by the following equation is output from multiplier CMk:

$$\mu \cdot e(n) \cdot x(n-k).$$

Delay element Dk0 delays the output signal of multiplier CMk by 1 cycle. Therefore, the output signal of delay element Dk0 is represented by the following equation:

$$\mu \cdot e(n-i) \cdot x(n-k-1).$$

Adder Sk0 adds the output signal of delay element Dk0 with the output signal of multiplier CMk. Therefore, the output signal of adder Sk0 is represented by the following equation:

$$\mu \cdot e(n) \cdot x(n-k) + \mu \cdot e(n-1) \cdot x(n-k-1).$$

Delay element De1 delays the output signal of adder Sk0 by 1 clock cycle. Therefore, the output signal of delay element Dk1 is represented by the following equation:

$$\mu \cdot e(n-1) \cdot x(n-k-1) + \mu \cdot e(n-2) \cdot x(n-k-2).$$

Adder Sk1 adds the output signal of delay element Dk1 with the output signal of multiplier CMk. Therefore, the output signal of adder Sk1 is represented by the following equation:

$$\mu \cdot \Sigma e(n-i) \cdot x(n-k-i).$$

The summation is taken from 0 to 2 for i.

Adder CAk adds tap coefficient hk (n) of the current cycle with the output signal of adder Sk1. Therefore, the output signal of adder CAk is represented by the following equation:

$$hk(n) + \mu \cdot \Sigma e(n-i) \cdot x(n-k-i).$$

Delay element DEk delays the output signal of adder CAk by 3 cycles for output. Therefore, tap coefficient hk (n) output at the current cycle is represented by the following equation:

$$hk(n) = hk(n-3) + \mu \cdot \Sigma e(n-i-3) \cdot x(n-k-i-3).$$

The summation is taken from 0 to 2 for i. Therefore, tap coefficient hk (n+1) of the next cycle is represented by the following equation:

$$hk(n+1) = hk(n-2) + \mu \cdot e(n-i-2) \cdot x(n-k-i-2).$$

The number of stages of the look ahead conversion is 2. Therefore, the second term in the right side of the above equation satisfies the relationship of the following equation.

$$\mu \cdot \Sigma e(n-i-2) \cdot x(n-k-i-2) = \mu \cdot \Sigma e(n-i) \cdot x(n-k-i)$$

Each correction stage of coefficient update circuit 3 of FIG. 4 is the direct format version for the aforementioned equation. Following this look ahead conversion, a retiming process is carried out to re-set the timings while maintaining the timing relationship of the signals. The direct FIR filter of filter processing unit 1 is converted into a transposition filter.

Figure 6:
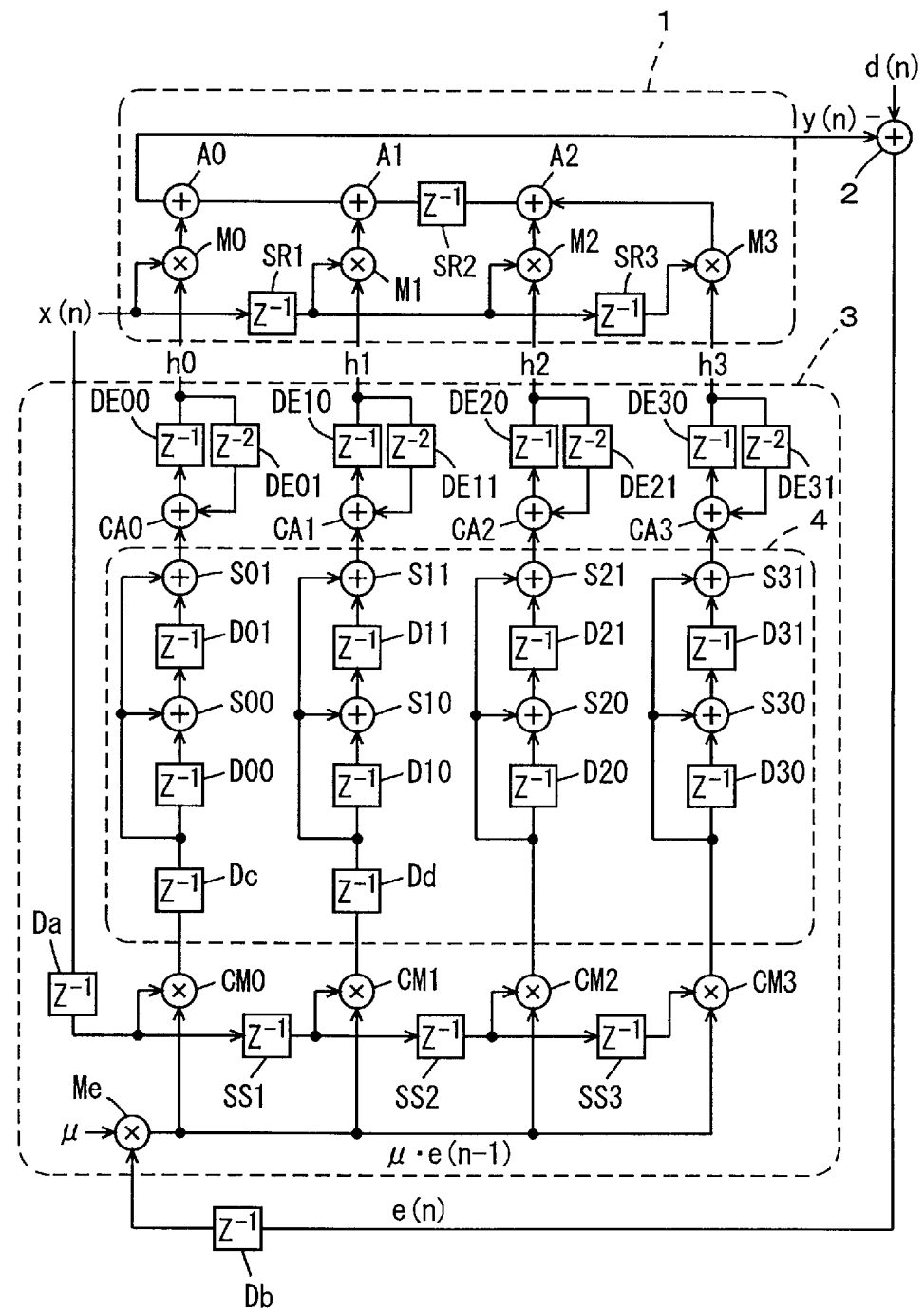
FIG. 6 shows a structure of the adaptive equalizer of the second arrangement step according to the second embodiment of the present invention.

FIG. 6 shows a structure of an adaptive equalizer after completion of the retiming process of the second embodiment of the present invention. In filter processing unit 1 of FIG. 6, adders A0~A2 are provided corresponding to multipliers M0~M2, respectively. The output signal of multiplier M3 is applied to adder A2. In the path receiving input signal x(n), delay elements SR1 and SR3 of 1 delay cycle are provided corresponding to multipliers M1 and M3, respectively. The output signal of delay element SR1 is applied to multiplier M2. The output signal of delay element SR1 is applied to delay element SR3.

A delay element SR2 that delays the output signal of adder M2 by 1 clock cycle to apply the delayed signal to adder A1 is arranged between adder A1 and A2. Adder A1 adds the output signals of multiplier M1 and delay element SR2 to provide the addition result to adder A0. Adder A0 adds the output signals of multiplier M0 and adder A1 to generate an output signal y(n).

A delay element Da delaying input signal x(n) by 1 clock cycle to provide the delayed signal to delay element SS1 is provided for adjusting the timing after updating the tap coefficient. Also, a delay element Db is provided to delay the output signal of error detection circuit 2 by 1 clock cycle to provide the delayed signal to multiplier Me. Delay elements DE0~DE3 of 3 clock delay are divided into delay elements DE00~DE30 delaying the output signals of adders CA0~CA3 by 1 clock cycle to generate tap coefficients h0~h3, and delay elements DE01~DE31 delaying tap coefficients h0~h3 by 2 clock cycles to apply the delayed signal to corresponding adders CA0~CA3. In filter processing unit 1 formed of the transposition filter, the multiplication results of multipliers M2 and M3 are delayed by 1 clock cycle by delay element SR2 provided between adders A1 and A2 and transferred. The output signal of delay element SR1 is directly applied to delay element SR3. Therefore, output signal y(n) from filter processing unit 1 is represented by the following equation:

$$y(n) = h0\ (n) \cdot x(n) + h1(n) \cdot x(n-1) + h2(n-1) \cdot x(n-2) + h3(n-1) \cdot x(n-3).$$

The coefficient values of the preceding cycle are used for tap coefficients h2 and h3. Delay elements Dc and Dd delaying an applied signal by 1 clock cycle are interposed at the outputs of multipliers CM0 and CM1, respectively, for coefficients h0 and h1 in coefficient update circuit 3 in order to provide consistency among the timings of the coefficients. Accordingly, the timing relationship between the tap coefficients and the input signal in each operation unit of filter processing unit 1 matches. More specifically, tap coefficients h2 and h3 corresponding to update according to error signal e(n) of the preceding-by-one cycle with respect to tap coefficients h0 and h1. Therefore, the timing relationship of the tap coefficient and the input signal in these multipliers match since the signal of the preceding-by-one cycle is respectively provided.

Delay elements Da and Db are provided to adjust the timing of error signal e(n) with respect to input signal x(n). Accordingly, the timing for the case where reference signal d(n) is delayed by 1 cycle and output at the time of determination can be adjusted. Delay elements Da and Db prevent the path where signals x(n) and e(n) are propagated from becoming critical.

Following the completion of this retiming process as shown in FIG. 6, transfer function of $1 + Z^{-1} + Z^{-2}$ in the gradient addition module of look ahead conversion unit 4 is converted equivalently into transfer function $(1-Z^{-3})/(1-Z^{-1})$. This is realized using a delay element that delays an applied signal by 1 clock cycle and a delay element that delays an applied signal by 3 clock cycles.

Figure 7:
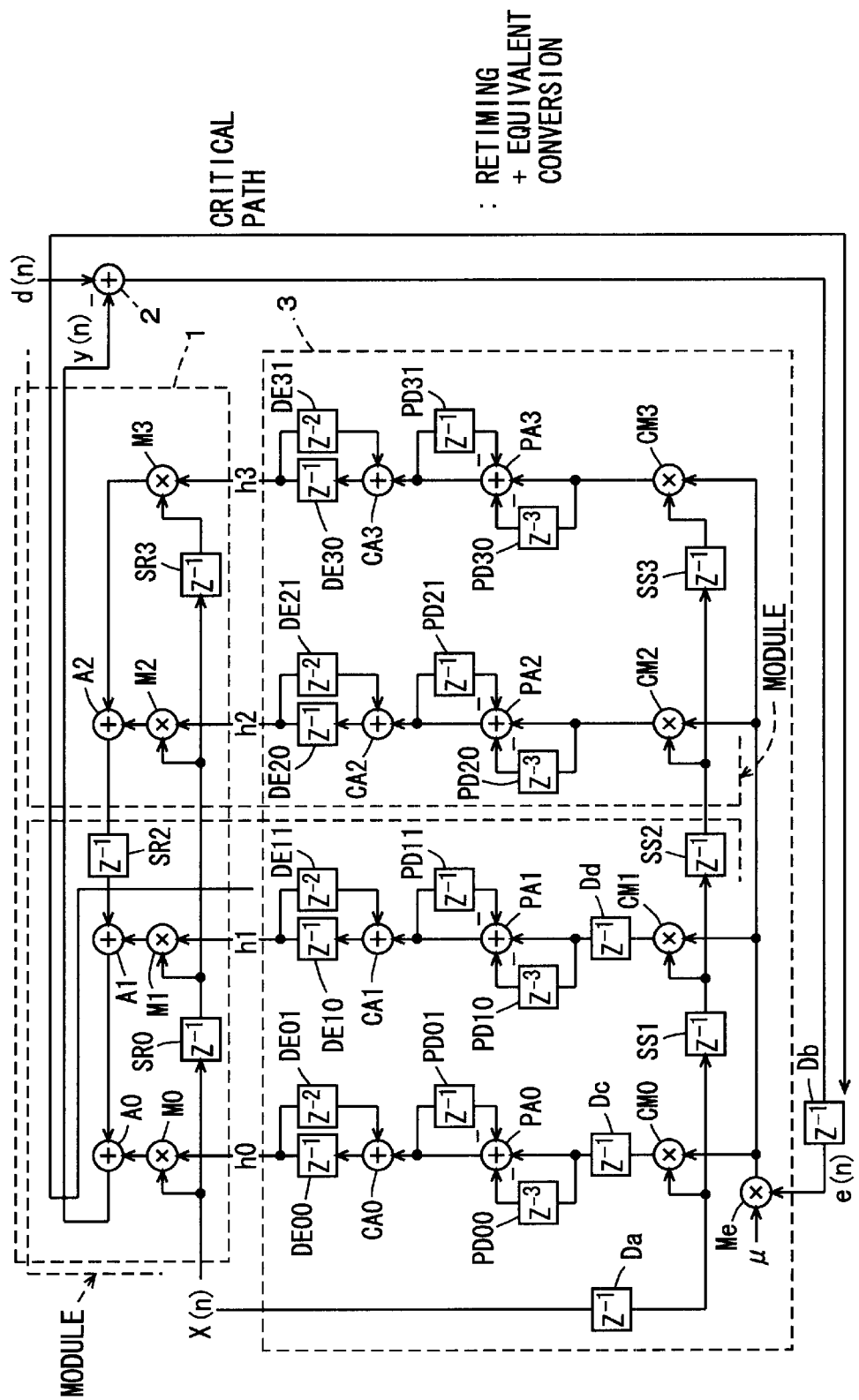
FIG. 7 shows a structure of an adaptive equalizer according to the second embodiment of the present invention.

FIG. 7 shows a structure of an adaptive equalizer subjected to transfer function conversion. In FIG. 7, the structure of the coefficient correction stage corresponding to each of tap coefficients h0~h3 is identical. The gradient addition modules are each replaced with a recursive filter. More specifically, the correction stage for tap coefficient hk includes a delay element DDk0 delaying an applied signal by 3 clock cycles, an adder PAk, and a delay element PDk1 delaying the output signal of adder PAk by one clock cycle to provide the delayed signal to adder PAk.

Adder PA0 subtracts the output signals of delay elements PDk0 and PDk1 from the applied signal to provide the result to a corresponding adder CAk. The output signals of delay elements Dc and Db are applied to adders PA0 and PA1, respectively. The output signals of multiplier CM2 and CM3 are applied to adders PA2 and PA3, respectively. By the conversion of the transfer function, the number of adders is reduced, and the circuit complexity is alleviated and the signal propagation delay is reduced. The adaptive equalizer of FIG. 7 has a recursive filter replacing the direct type filter structure in the look ahead conversion unit, and the operation is identical. The critical path of the adaptive equalizer, of FIG. 7 is the path from the output of delay element DE10 to the output of error detection circuit 2. Therefore, the critical path has a delay of 1 multiplication and 3 additions and has a constant delay value independent of tap length N (−4). Thus, an adaptive equalizer that can carry out high speed processing can be realized.

The circuitry for each of tap coefficients h0~h3 has substantially an identical structure, and can be formed in a systolic structure. In the structure of FIG. 7, the portions of the same structure are set as modules. More specifically, the portion of tap coefficients h0 and h1 are set as one module, and the portion of tap coefficients h2 and h3 are set as another module. Here, delay elements SR2 and SS2 are included in the left-side module of FIG. 7. Thus, the adaptive equalizer can be extended easily.

When the number of stages, L, of the look ahead conversion is equal to ½ the tap length N, the section of half the entire taps, N/2, may be made as one module.

According to the second embodiment, the number of stages of the look ahead conversion is set to ½ of all the taps, and the direct filter structure is converted into the transposition filter structure by carrying out look ahead conversion and the retiming process. Therefore, the latency in the input/output response adjustment is reduced to implemented an accurate filter process. Also, the critical path is reduced to implement an adaptive equalizer that operates at high speed without increasing the circuit scale.

Third Embodiment

FIG. 8 schematically shows a structure of a filter processing unit of an adaptive equalizer according to a third embodiment of the present invention. Filter processing unit 1 of FIG. 8 includes N taps. This filter processing unit has a structure obtained as a result of look ahead conversion with the number of look ahead-stages, L, as N/2 and a subsequent retiming process. Filter processing unit 1 includes multipliers M0~Mn−1 provided corresponding to taps h0~h2−1, respectively, and adders A0~An−2 provided corresponding to multipliers M0~Mn−2, respectively. Here, N=2·L, where L represents the number of stages of the look ahead conversion. Delay elements SR0, SR2, ... SRN−2 are arranged at alternate tap coefficients, and delay elements SR1~SRN−3 are arranged between the adders in the propagation path of input signal x(n). These delay elements SR0~SRN−2 are arranged alternately in the path from which output signal y(n) is provided and in the path through which input signal x(n) is transmitted.

With two adjacent taps being one set, filter processing unit 1 is divided into module units MD#0~MD#L−1. Each of modules MD#0~MD#L−2 includes a delay element to delay an input signal, and a delay element to delay an output signal. In each module, a delay element SR2i is arranged between multipliers Mi and Mi+1. For the two stages of cascaded adders Ai and Ai+1, delay element SRi+1 is arranged at the input of adder Ai+1.

In the structure shown in FIG. 8, module units MD#0~MD#L−2 in filter processing unit 1 have the same structure. Only module unit MD#L−1 at the last stage has the output signal of multiplier MN−1 applied to adder AN−2.

In this half TrLMS architecture, the output signal is transmitted via a delay element, and the timing of the tap coefficient must be adjusted accordingly. In the tap coefficient update unit provided corresponding to each of module units MD#0~MD#L−1, delay elements corresponding to delay elements Dc and Dd of FIG. 7 are arranged to adjust the timing of the tap coefficients. As to module units MD#0~MD#L−1, the delay element additionally inserted at the tap stage in module unit MD#i has a delay of (L−1−i) cycles, with i being from L−1 to 0.

By virtue of the module structure shown in FIG. 8, the number of taps N (N is an even number) can be increased easily. In this structure, the portion of N/2 may be constructed as one module as in the previous embodiment.

Figure 9:
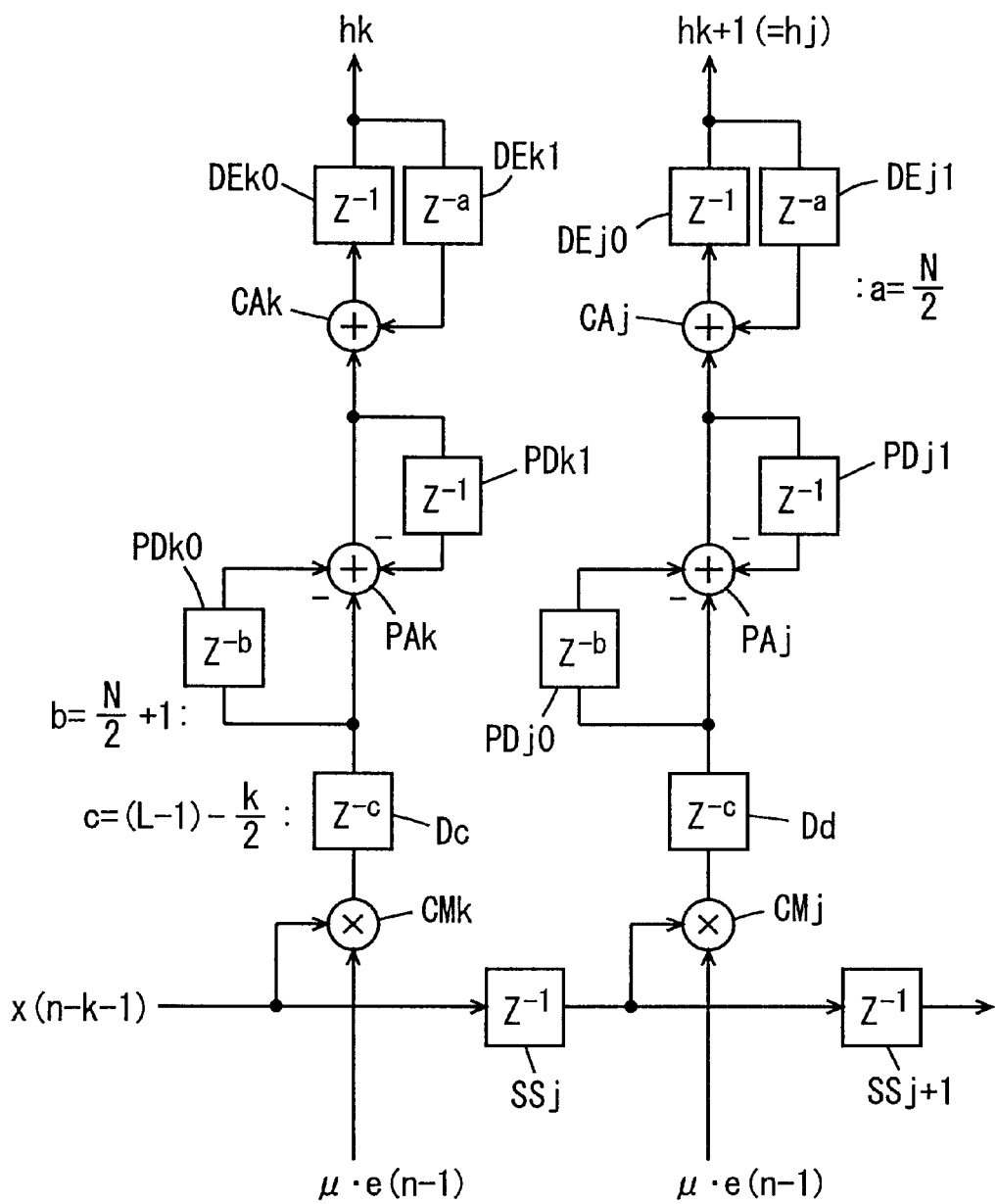
FIG. 9 shows a structure of one stage of a coefficient update circuit of the adaptive equalizer of FIG. 1.

FIG. 9 shows a structure of a coefficient correction stage included in the coefficient update circuit of module unit MD#k/2 shown in FIG. 8. Components corresponding to those of the coefficient correction stage of FIG. 7 have the common reference characters allotted, and detailed description thereof will not be repeated. In module unit MD#k/2, tap coefficients hk and hk+1(=hj) are output.

Delay time a of delay elements DEk1 and DEj1 is represented by a =L=N/2. Delay clock cycle b of delay elements PDk0 and PDj0 is provided as a+1=L+1=(N/2)+1.

Delay cycle c of delay elements Dc and Dd to adjust the timing of tap coefficients hk and hj in module unit MD#k/2 is provided by (L−1)−(k/2).

Input signal x (n−k−1) is applied to module unit MD#k/2. The critical path corresponds to 1 multiplication and 3 additions.

By utilizing the modules shown in FIGS. 8 and 9, a transposition filter is formed with the number of look ahead stages L reduced to L/2, when tap length N is an even number, to shorten the critical path. Furthermore, expansion of the tap length of the adaptive equalizer can easily be accommodated due to modulenization.

In the structure shown in FIG. 9, all the modules can have a common structure when delay elements Dc and Dd are formed of variable delay elements.

Modification

Figure 10:
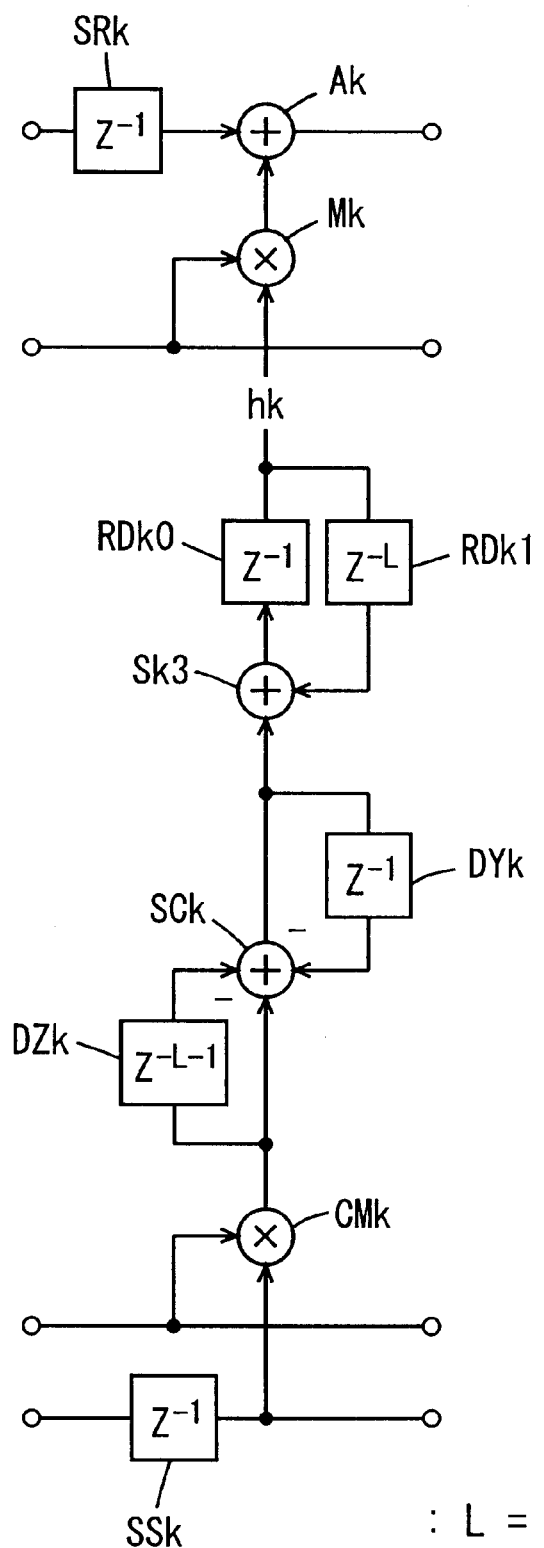
FIG. 10 shows a modification of the third embodiment of the present invention.

FIG. 10 shows a modification of the third embodiment of the present invention. The structure of a module is shown when the number L of stages of the look ahead conversion is equal to tap length L. In FIG. 10, components corresponding to those shown in FIG. 3 have the same reference character allotted. A filter processing unit and a filter coefficient correction stage are arranged with respect to tap coefficient hk.

According to the module structure of FIG. 10, the number of delay cycles of delay element RDk1 is L. The number of delay cycles of delay element DZk is L+1. The module shown in FIG. 10 is connected by N stages. A delay element SRk is short-circuited in the first input stage module (module corresponding to tap coefficient h0). Accordingly, an adaptive equalizer of tap number N (=L) can be realized. The tap length of the adaptive equalizer can easily be increased.

According to the third embodiment of the present invention, the filter processing unit and the correction stage of the coefficient update circuit are modulenized in the adaptive equalizer. Therefore, the tap length expansion can be easily accommodated.

According to the present invention, the filter processing unit represented by a direct FIR filter is converted into a transposition FIR filter by rearrangement of the delay elements through look ahead conversion and a retiming process. Thus, an adaptive equalizer that can have the critical path shortened and that can carry out processing at high speed is implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An adaptive equalizer comprising:
a filter processing unit including a plurality of cascaded processing stages provided corresponding to taps, each of said processing stages including (i) a first multiplier for multiplying an input signal by a corresponding tap coefficient, (ii) a delay stage for delaying an output signal of a preceding processing stage, and (iii) an adder for adding an output signal of said delay stage with an output signal of said first multiplier to provide an addition result to a next stage, the processing stage at a first stage including a multiplier for multiplying said input signal by a corresponding tap coefficient to provide a resultant signal to a subsequent processing stage at a next stage; and
a tap coefficient set circuit for setting the tap coefficients according to an error between an output signal of said filter processing unit and a reference signal, said tap coefficient set circuit including a coefficient correction stage of a same structure provided corresponding to each tap coefficient and having a transfer function given by a product of the transfer function of an all pole filter and a transfer function of an all zero filter.

2. The adaptive equalizer according to claim 1, wherein each said coefficient correction stage of said tap coefficient set circuit is configured to relate a tap coefficient of a preceding-by-L cycle with a tap coefficient of a next cycle, with L being an integer not greater than the number of the taps.

3. The adaptive equalizer according to claim 2, wherein each said tap coefficient correction stage includes a filter circuit having a transfer function of $(1-Z^{-L-1})/(1-Z^{-1})$.

4. The adaptive equalizer according to claim 2, wherein said L is equal to the number of the taps.

5. The adaptive equalizer according to claim 1, each said coefficient correction stage including
a second multiplier multiplying a delay signal of a signal representing said error and the input signal of a preceding-by-L cycle,
a first delay circuit delaying an output signal of said second multiplier by (L+1) cycles,
a second delay circuit for delaying an applied signal by 1 cycle,
a subtractor for subtracting output signals of the first and second delay circuits from an output of said second multiplier, said second delay circuit delaying an output signal of said subtractor, and said delay signal of the signal representing said error having a delay time according to a location of a corresponding tap,
a second adder receiving an output signal of said subtractor,
a third delay circuit for delaying an output signal of said second adder by 1 cycle to generate a corresponding tap coefficient, and
a fourth delay circuit delaying an output signal of said third delay circuit by L cycles for application to said second adder, said second adder adding an output signal of said subtractor with an output signal of said fourth delay circuit to provide an addition result to said third delay circuit.

6. An adaptive equalizer comprising:
a filter processing unit including a plurality of processing stages corresponding to taps and connected in series with each other, and having a forward path and a backward path, each of said plurality of processing stages including (i) a multiplier for multiplying an input signal applied on the forward path by a corresponding tap coefficient, (ii) an adder arranged on the backward path, for adding a signal on the backward path transmitted from a subsequent processing stage with an output signal of said multiplier for transmission onto the backward path,
a delay stage providing a delay of 1 cycle interposed alternately at the processing stages in said forward path and said backward path; and
a tap coefficient set circuit for setting said tap coefficients according to an error between an output signal of said filter processing unit and a reference signal, said tap coefficient set circuit including a coefficient correction stage of a same structure provided corresponding to each tap coefficient and having a transfer function given by a product of a transfer function of an all zero filter and a transfer function of an all pole filter.

7. The adaptive equalizer according to claim 6, wherein each coefficient correction stage of said filter coefficient set circuit is configured to relate the tap coefficient of a preceding-by-L cycle with the tap coefficient of a next cycle, said L being ½ times a tap length.

8. The adaptive equalizer according to claim 7, wherein each of the tap coefficient correction stages includes a filter circuit having a transfer function of $(1-Z^{-L-1})/(1-Z^{-1})$.

9. The adaptive equalizer according to claim 6, each of the tap coefficient correction stages including
a first delay circuit delaying an applied input signal by 1 cycle,
a second multiplier for multiplying an error signal indicating said error of a preceding-by-one cycle by an input signal of the preceding-by-one cycle,
a second delay circuit delaying an output signal of said second multiplier by 1 cycle,
a third delay circuit for delaying an output signal of said second delay circuit by (N/2)+1 cycles, said N indicating a tap length,
a fourth delay circuit for delaying an applied signal by 1 cycle,
a subtractor for subtracting output signals of the third and fourth delay circuits from an output signal of said second delay circuit, a fifth delay circuit for delaying an applied signal by 1 cycle to generate a corresponding tap coefficient, a sixth delay circuit delaying an output signal of said fifth delay circuit by (N/2) cycles, and an adder adding an output signal of said subtractor with an output signal of said sixth delay circuit for application to said fifth delay circuit.

10. A method of designing an adaptive equalizer correcting a tap coefficient so as to minimize an error between a reference signal and an output signal thereof, filtering an input signal according to the corrected tap coefficients and generating said output signal, said method comprising the steps of:

arranging a filter processing stage and a tap coefficient set stage using a direct filter structure, carrying out look ahead conversion of relating a tap coefficient of a preceding-by-L cycle with the tap coefficient of a next cycle to rearrange said filter processing stage and said tap coefficient set stage, carrying out a retiming process for timing reorganization while maintaining time relationship of signals to reorganize an arrangement of delay elements for conversion into a transposition filter, and converting said tap coefficient set stage into a filter stage having a transfer function of $(1-Z^{-L-1})/(1-Z^{-1})$ by equivalent conversion of a transfer function of the transposition filter.

11. The method according to claim 10, further comprising the step of setting said L to a value equal to a tap length of said adaptive equalizer.

12. The method according to claim 11, further comprising the step of modulenizing a portion corresponding to each said tap coefficient.

13. The method according to claim 10, further comprising the step of setting said L to a value equal to ½ times a tap length of said adaptive equalizer.

14. The method according to claim 13, further comprising the step of modulenizing a structure of a portion of taps successively adjacent in said adaptive equalizer.

15. The method according to claim 10, wherein the step of converting into a filter stage comprises the step of making a stage corresponding to each tap coefficient for calculating a corresponding tap coefficient into a same structure.

16. The method according to claim 10, further comprising the step of modulenizing a portion corresponding to half an entire tap length of said adaptive equalizer.

* * * * *